United States Patent
Dedic et al.

(10) Patent No.: US 11,543,850 B1
(45) Date of Patent: Jan. 3, 2023

(54) HIGH-Q CLOCK BUFFER

(71) Applicant: Acacia Communications, Inc., Maynard, MA (US)

(72) Inventors: Ian Dedic, London (GB); Gavin Allen, Greenwood (AU); David Enright, Maldon (GB); Bo Yang, Sunnyvale, CA (US); Tarun Gupta, Santa Clara, CA (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/777,968

(22) Filed: Jan. 31, 2020

Related U.S. Application Data (60) Provisional application No. 62/950,612, filed on Dec. 19, 2019.

(51) Int. Cl.
*G06F 1/08* (2006.01)
*H03B 5/12* (2006.01)
*H03F 3/50* (2006.01)

(52) U.S. Cl.
CPC ............. *G06F 1/08* (2013.01); *H03B 5/12* (2013.01); *H03F 3/505* (2013.01); *H03F 2200/312* (2013.01)

(58) Field of Classification Search
CPC ............. H03F 3/505; H03F 2200/312; H03F 2203/5031; H03M 1/124; G06F 1/08; H03B 5/12
USPC ............. 327/109; 331/57, 74; 330/277, 290
See application file for complete search history.

(56) References Cited

U.S. PATENT DOCUMENTS

| | | | |
|---|---|---|---|
| 7,902,882 B2 * | 3/2011 | Vimercati | H03K 19/0005 327/108 |
| 2005/0088247 A1 * | 4/2005 | Yasui | H03K 3/011 331/57 |
| 2009/0315594 A1 * | 12/2009 | Pentakota | H03F 3/505 327/109 |

* cited by examiner

Primary Examiner — Arnold M Kinkead
(74) Attorney, Agent, or Firm — Joseph D'Angelo (57) ABSTRACT

An apparatus and system for a clock buffer. The clock buffer comprises a source follower, and the source follower comprises a voltage source and a resistor.

15 Claims, 6 Drawing Sheets

HIGH-Q CLOCK BUFFER

CROSS REFERENCE TO RELATED APPLICATIONS AND PRIORITY CLAIM

This application claims the benefit U.S. Provisional Patent Application Ser. No. 62/950,612 filed Dec. 19, 2019 entitled "High-Q Clock Buffer," which is hereby incorporated herein by reference in its entirety for all purposes. This application is related to co-pending U.S. Patent Application Ser. No. 62/879,095 filed Jul. 26, 2019 entitled "Switch;" U.S. patent application Ser. No. 16/564,044 filed Sep. 9, 2019 entitled "High-Q Switch Inductor;" U.S. patent application Ser. No. 16/587,191 filed Sep. 30, 2019 entitled "Distributed Voltage Controlled Oscillator (VCO);" and U.S. patent application Ser. No. 16/685,063 filed Nov. 15, 2019 entitled "Clock Buffer Inductor;" all of which are hereby incorporated by reference in their entirety for all purposes.

BACKGROUND

A clock may be used to provide a timing signal in a digital circuit.

BRIEF DESCRIPTION OF THE FIGURES

Various aspects and embodiments of the application will be described with reference to the following example embodiments. It should be appreciated that the figures are not necessarily drawn to scale.

SUMMARY

An apparatus and system for a clock buffer comprising a source follower.

DETAILED DESCRIPTION

In many embodiments, a communication or transmission system may include a transmitter and a receiver. In some embodiments, a communication system may include two transceivers. In most embodiments, a transmission, such as a set of bits, may be encoded in a signal at a transmitter. In most embodiments, a transmitter may transmit an encoded signal to a receiver. In certain embodiments, a receiver may receive a signal from a transmitter and decode the signal into information. In almost all embodiments, there may be a number of conditions that may impact the signal which may make it hard to decode the information. In certain embodiments, a signal may be transmitted over an RF connection. In other embodiments, a signal may be transmitted over an optical link.

In some embodiments, in a coherent optical system, a digital electrical signal may be received. In certain embodiments, a digital electrical signal may be converted to an analog signal. In many embodiments, an analog signal may be converted to an optical signal. In almost all embodiments, a received optical signal may need to be converted to an analog signal, which may need to be converted to an electrical signal.

In most embodiments, a coherent optical communication system may have high data rates. In almost all embodiments, it may be necessary to divide data received into discrete time intervals. In many embodiments, a clock on a transmitter may determine when a signal is sent out. In some embodiments, an analog to digital converter may determine when samples are taken and converted into a digital format. In many embodiments, in a coherent optical system, it may be necessary to do a conversion between a digital signal and an analog signal at many gigabaud per second. In most embodiments, in a coherent optical signal, it may be necessary to convert an optical signal to an analog signal at many gigabaud per second. In some embodiments, in a coherent optical system, it may be necessary to convert an analog signal to an electrical signal at many gigabaud per second.

In most embodiments in a coherent optical system, a conversion between digital to analog, analog to optical, optical to analog, and analog to digital may need to run at speeds of 50-60 gigabaud or faster per second. In many embodiments, accuracy of a conversion may need to be high and signal to noise distortion of the signal may need to be low. In almost all embodiments, accurate conversion of a signal may require an accurate clock at both a transmission site and at a receive site. In most embodiments, a clock may need to run at a high speed and have very high slew rates. In certain embodiments, slew rate may be 2 pi times the frequency of the clock. In many embodiments, if a clock moves in time, such as jittering backward or forward in time, this may introduce a time error into a communication system which may then introduce a voltage error which may degrade the accuracy of a communication. In some embodiments herein, jitter may refer to phase noise (i.e. random, undesired fluctuations) in the wave produced by a voltage-controlled oscillator (VCO).

In some embodiments, there may be 20 picoseconds between transmitted or received data samples. In certain embodiments, a clock may be used to denote the time between samples. In many embodiments, a same amount of jitter may create bigger voltage errors at higher frequencies. In most embodiments, a clock may need to be distributed to each circuit or device that uses the clock. In many embodiments, a distribution of a clock may need to cover a big area. In certain embodiments, distributing a clock of a VCO across a distance may take power. In almost all embodiments, it may be beneficial to be able to generate and distribute a clock signal without dissipating power and keeping jitter to a minimum.

In many embodiments, a clock may need to provide a signal to denote a sampling time. In certain embodiments, a clock may need to be distributed to a number of different locations performing a conversion of a signal. In most embodiments, it may require power to distribute a clock to different locations or circuits that use the clock. In further embodiments, it may require power to drive or distribute a clock.

In many embodiments, a clock may be a voltage-controlled oscillator (VCO). In certain embodiments, a VCO may be a ring oscillator. Typically, a ring oscillator may be used as a clock for a digital signal processor (DSP). In other embodiments, a VCO may have a resonance tank or tank. In some embodiments, a tank may be formed by a resonance circuit with an inductor (L) and a capacitor (C).

In many embodiments, an LC tank type VCO may be used to provide a clock for an ADC or DAC. In some embodiments, Applicants have realized that ring oscillators may be used at lower frequencies and are able to drive a higher load. In most embodiments, Applicants have realized that a ring oscillator may not be able to function efficiently at higher frequencies or when higher speed conversions are necessary, such as those required in an ADC or DAC of optical communications. In certain embodiments, it may not be possible to use a ring oscillator VCO at higher frequencies as the delay around the ring cannot be made small enough. In most embodiments, Applicants have realized it may be beneficial to use an LC tank type VCO to enable a clock that operates at higher frequencies. Conventionally, ring oscillators require much higher power consumption than LC oscillators for the same level of phase noise/jitter.

In certain embodiments, with an LC tank VCO, energy in the tank may flow between the L and the C at a given phase. In many embodiments, phase of a flow of energy around a tank of a VCO may denote a clock cycle. In most embodiments, tanks are referred to as having a Q ratio. In many embodiments, Q refers to the ratio between energy circulating around a tank and the amount of energy that is lost each time the energy flows around the tank. In most embodiments, a tank with a higher Q ratio is preferable as higher Q indicates lower energy loss for each clock cycle.

In many embodiments, it may be beneficial to generate a clock, buffer it, and distribute the clock signal using low power while limiting the amount of jitter in the clock signal. Typically, to distribute a clock signal to multiple circuits or locations, it may be necessary to buffer the clock signal. Generally, each time one adds a buffer, it may be necessary to add more power. Conventionally, a buffer adds noise and jitter into a system as it is an analog component. Usually, adding a buffer to a VCO may add to a load of the VCO. In most embodiments, an ideal buffer may have no input load, no capacitance, and be without a high Q.

In some embodiments, the current disclosure may enable a low-power, low jitter clock distribution for high-speed (tens of giga samples) multi-channel ADC and DAC. In certain embodiments, Applicants have realized that typical solutions for multi-channel applications may use multiple clock buffers which add power, require big inductors, and may cause skew between channels.

In almost all embodiments, a VCO may need buffering. In most embodiments, Applicants have realized that it may be beneficial to have a low power buffer for a VCO. In most embodiments, buffering may ensure that a load on the VCO does not get too big, ensures Q does not get too low, and stops feedback from getting injected back to the VCO. In many embodiments, a buffer separating a VCO from clocked circuits may provide isolation from non-clock frequency components that may create feedback. In almost all embodiments, anything that hangs on or is connected to an LC tank that has a low Q may suck energy out of the VCO, requiring the VCO to use more power. In some embodiments, a typical load for driving a converter may be large. In many embodiments, an input of a clock buffer may have small capacitance because that adds load back to the tank. In certain embodiments, it may be beneficial to have a high Q buffer and make it look like a pure capacitor. In almost all embodiments, it may be beneficial to use a buffer for a VCO that has little or no loading effect on the VCO.

In most embodiments, Applicants have realized with typical solutions, an input capacitance of buffers becomes part of the LC tank capacitance. In certain embodiments, Applicants have realized that conventional low-power CMOS clock buffers (lower power than Current Mode Logic (CML)) may have high input capacitance because of gate capacitance and Miller effect (feedback) capacitance, which adds to the load on an LC tank. In certain embodiments, CML may be a differential pair with resistive loads and high power as it draws a DC current. In most embodiments, Applicants have realized that because of phase shifts capacitance may appear lossy (partly resistive).

Conventionally, a CMOS inverter with a feedback resistance and a set voltage and AC capacity may have been used as a buffer for a VCO. In most embodiments, Applicants have realized that there may be at least two problems using a CMOS inverter. In some embodiments, a CMOS inverter may be inverting so output may be out of phase with input, where the input goes down, output goes up, which can cause gain and be subject to Miller capacitance. In many embodiments, Miller capacitance may refer to the feedback capacitance from output to input. In most embodiments, because an input and an output swing in different directions, voltage across a capacitor may change and magnify effects on capacitance, making it appear bigger. In certain embodiments, Applicants have realized that feedback from output to input may be part of transistors. In other embodiments, Applicants have realized that a CMOS inverter may normally have gain and a restricted bandwidth, which means there may be a large phase shift.

In many embodiments, Applicants have realized that a CMOS inverter may not have infinite bandwidth, may not be a perfect buffer, and may not be quite 180 degrees out of phase. In many embodiments, a CMOS inverter may look like a lossy capacitor. In most embodiments, a CMOS inverter may have a Q of 2 or 3. In some embodiments, Applicants have realized that a VCO has a Q of 10 or 15. In most embodiments, Applicants have realized that adding a low Q buffer, such as with a CMOS inverter with a Q of 2 or 3, to a VCO with a Q of 10 or 15, may result in VCO noise and power going up.

In many embodiments, Applicants have realized that a combination of large and lossy capacitance lowers a Q of a tank, causing degraded VCO phase noise and increased power consumption. In certain embodiments, with respect to typical solutions, Applicants have realized it may be necessary to drive a load capacitance or resonant tank, and this may need to be positioned some distance away from a first buffer stage. In some embodiments, Applicants have realized with typical solutions a transmission line maybe used to connect the first stage to a second stage at the far end of the transmission line, but driving this transmission line increases power consumption.

In most embodiments, Applicants have realized that conventionally a load for driving converters may be large and current solutions for multi-channel application use multiple clock buffers which add power, require big inductors and may cause skew between channels. In other embodiments, Applicants have realized that a buffer input capacitance may become part of an oscillator and loads the oscillator. In most embodiments, Applicants have realized that a conventional one single ended source follower may degrade power, which may result in an unwanted amount of phase noise and not have much capacitance. In many embodiments, Applicants have realized that a CMOS inverter may have a low Q.

In almost all embodiments, Applicants have realized that a CMOS inverter may have a negative impact on a VCO in terms of gain and noise. In many embodiments, with a CMOS inverter phase noise in a VCO may be undesirable and may have low capacitance, which may be very lossy. In almost all embodiments, Applicants have realized it would be beneficial to lower capacitance and get rid of the Miller effect.

In many embodiments, Applicants have realized it may be beneficial to use a push-pull source follower as a first stage of a VCO buffer or clock buffer. In almost all embodiments, Applicants have realized that a high Q input capacitance may be beneficial to a clock or VCO buffer. In many embodiments, a push-pull source follower may have a high Q. In almost all embodiments, Applicants have realized that a push-pull source follower may have low capacitance. In many embodiments, Applicants have realized that a push-pull source follower may not be subject to the Miller effect. In most embodiments, an input capacitance of a push-pull source follower may be smaller than a CMOS inverter and may have higher Q compared to the CMOS inverter, where the push-pull source follower may have a ~10 × smaller effect on Q of an LC tank.

In certain embodiments, a push-pull source follower may not have gain and an input and output may be roughly in phase with each other. In many embodiments, input and output capacitance may go in the same direction at the same time. In some embodiments, a push-pull source follower may look like an ideal capacitor and have high Q. In most embodiments, a push-pull source follower may have better gain on a size of a capacitor because it is not subject to the Miller effect.

In some embodiments, a source follower may have a much lower input capacitance because a gate-source component, which may be within a FET, may be bootstrapped by an output, and a gate-drain component may not suffer from Miller effect like an inverter. In certain embodiments, a Q of an input capacitance may be increased because a drain component may not have a phase shift, and a bootstrapped (divided) source component (with phase shift) may be 10 × lower than a Miller (multiplied) capacitance of an inverter. In many embodiments, a CMOS buffer may be an inverting buffer so feedback capacitance from the output to the input (usually drain to gate) may have miller effect capacitance which increases the capacitance seen at the input. In some embodiments, a follower buffer output may follow an input signal so there may be no miller effect for capacitance. In certain embodiments, gate to drain capacitance may have no phase shift and may be high Q. In many embodiments, gate to source capacitance may be reduced as a source follows a gate so this capacitance is reduced (bootstrapping of capacitance). In certain embodiment, any effect on a total input Q for capacitance may be reduced as the effective capacitance is also reduced. In a particular embodiment, for a CMOS buffer, miller effect on gate-drain may be equal to a higher cap with low Q. In many embodiments, for a follower a gate-source capacitance may be bootstrapped so the cap is reduced. In many embodiments, a push-pull source follower may use AC coupling capacitors to drive gates, but with DC biasing resistances to separate N and P bias voltages instead of connecting to the inverter output. In many embodiments, when considering load on a circuit, lower capacitance may indicate it is easier to drive the circuit, which may require lower current and, in turn lower power consumption. In some embodiments, if a driving circuit is a resonant (LC tuned) circuit, higher Q may mean lower current to drive the resonance circuit, which may in turn result in lower power consumption.

In almost all embodiments, Applicants have recognized that a high-Q distributed VCO may need clock buffers with an input capacitance that is small and has high Q, and that this may be provided by a push-pull source follower. In some embodiments, a push-pull follower may have AC coupling to allow separate biasing of the NMOS and PMOS gates. In most embodiments, a push-pull source follower may have an N at a top part of the source follower and a P at a bottom part of the source follower instead of a P at the top and a N.

In many embodiments, a push-pull source follower may have a smaller phase shift than a CMOS inverter because it requires gain and is not subject to the Miller effect. In certain embodiments, if one has a capacitor between input and output that has gain of 1, then it may double the capacitance. In many embodiments, if one has a capacitor with gain of 0.8, then capacitance may be divided by 0.5. In most embodiments, a push-pull source follower may offer 10 times lower capacitance looking in at an inverter and may also look like an ideal capacitance. In almost all embodiments, a push-pull source follow may have almost no effect on a VCO where a CMOS inverter may have an undesirable effect on the VCO.

In almost all embodiments, Applicants have realized it was not previously understood that a buffer with an input capacitance with high Q is desirable and beneficial for a VCO. In many embodiments, Applicants have realized that a push-pull source follower buffer may be power efficient and may not require much current. In almost all embodiments, an effect of a push-pull source follower may be better than the effect of a CMOS inverter on a VCO. In certain embodiments, a push-pull source follower may have a Q of 20 while a CMOS inverter may have a Q of 2, resulting in a five times lower capacitance and 10 times the Q, a factor of 50 improvement with a push-pull source follower compared to the CMOS inverter. In certain embodiments, a push-pull source follow may appear as an ideal buffer.

In some embodiments, a push-pull follower may be followed by a second stage to a clock buffer consisting of a push-pull cascode circuit, the output of which may drive a load capacitance or resonant LC tank. In many embodiments, a transmission line may be used to connect a first stage and a second stage push-pull follower, which may be matched to an output impedance of the first stage, an input impedance of the second stage, or both. In most embodiments, a transmission line may effectively disappear inside a two-stage buffer and no extra power may be needed to drive it.

In certain embodiments, a distributed VCO where several parallel VCOs may be connected together by a low-loss transmission line to form a high-Q "distributed LC tank" structure may enable a distributed low jitter clock. In some embodiments, it may be necessary to buffer a voltage to drive ADC/DAC circuits of a distributed clock without degrading the Q of the tank, while minimizing buffer power consumption. In some embodiments, input capacitance of buffers may become part of a LC tank capacitance.

In further embodiments, addition of a second push-pull cascode stage (common-gate) to a first push-pull source follower may allow a "zero-power" transmission line to be used to connect the two stages, solving a problem of how to further distribute clocks and drive a load without power increase over that of the two-stage buffer itself (first and second push-pull followers). In certain embodiments, a two-stage buffer configuration may be a current-mode signal which may push and pull current to an output resonant load. In most embodiments, a two-stage buffer may not have Miller capacitance in a signal path though there may be voltage gain at an output node.

In certain embodiments, insufficient gain may arise in an implementation of a clock distribution using a two-state buffer circuit. In some embodiments, there may be a limitation of a transmission line impedance. In other embodiments, a current drive may be possible with a series of devices for the current transfer to the output for a given input voltage swing. In certain embodiments, a large load capacitance, which may need a larger current, may be met using a third current driving stage to keep a follower/t-line sizing reasonable. In some embodiments, a transmission line may have far side termination—not a near and far side termination.

In many embodiments, the current disclosure may enable an efficient way to distribute a VCO clock and drive a load while consuming limited power. In many embodiments, Applicants have realized a resonance circuit may be better as amount of power gained may be proportionate to the Q. In many embodiments, the current disclosure may enable a buffer that does not load a VCO. In many embodiments with a push-pull follower, there may be fixed currents that flow into transistors creating an efficient resonance circuit. In most embodiments, a push-pull follower may not load a VCO and may enable a buffer that drives a resident load.

In some embodiments, if one matches an output impedance of a first stage of a buffer to an input impedance of a second stage buffer with a transmission line of the corresponding impedances, one can distribute a clock between the buffers for no or minimal transmission cost. In a particular embodiment, if there is an output impedance of 50 ohms and an input impedance of 50 ohms, then there may be no cost to transmit the VCO between the output and the input.

In most embodiments, a clock buffer with low capacitance may drive a load. In certain embodiments, if a load isn't in a same place as a VCO, a clock buffer may be stretched using a transmission line to move, in terms of a circuit, an input stage next to the VCO and the transmission line may move, in terms of the circuit, an output stage next to the VCO. In many embodiments, when a transmission line has a matched impedance to the input stage and the output stage, a circuit may show the transmission line to be "invisible" in the circuit and match the power of the circuit. In many embodiments, a 50 ohm resistor and a transmission line with 50 resistance at an input and output may look the same.

In most embodiments, a signal source connected between an input stage and an output stage may be the same except for a slight loss of a couple tenths of a percent due to a transmission line. In many embodiments, a transmission line may drive a resonance load. In most embodiments, matching a transmission line to an output stage impedance and an input stage impedance may, in terms of a circuit, move the output stage and input stage next to each other even when separated by a distance corresponding to the transmission line. In most embodiments, a transmission line may lose a few tenths of a percent or db of power. In many embodiments, a transmission line may enable an input and output stage to be separated from each other.

In most embodiments, a low input capacitance may drive a load and an output stage may be located in a different place through the use of an impedance matched transmission line. In certain embodiments, a transmission line may be any length. In other embodiments, a transmission line may be 1 mm. In further embodiments, a transmission line may be 2 mm. In many embodiments, a transmission line may move a clock signal with almost no power loss. In almost all embodiments, the ability to move a clock for almost no cost provides a huge advantage for circuit layout.

In some embodiments, it may be possible to split a clock with a transmission line. In a particular embodiment, if it is desired to split a clock or send the clock to two inputs, an output zed may be 25 ohms, a transmission line may be 25 ohm transmission lines, and input stages may be 50 ohms and 50 ohms. In most embodiments, a transmission line may be split at almost no cost to the circuit. In some embodiments, a VCO may be distributed to 4 points. In most embodiments, a VCO may be tuned without impacting a VCO buffer.

In certain embodiments, a first stage buffer and a second stage buffer may not have enough gain. In some embodiments, an inverter may be added between the first stage buffer and the second stage buffer driven by a push-pull source follower. In many embodiments, it may be desirable to have a bigger output signal than supplied as an input signal. In almost all embodiments, an inverter may have a low capacitance and may supply gain to a circuit. In many embodiments, an output impedance of an inverter may not be matched and may be a high current output. In certain embodiments, one end of an inverter may be matched to a portion of a buffer and a second end of the inverter may not be matched. In some embodiments, an inverter may provide a current driver into a circuit. In some embodiments, if additional gain is needed, then an inverter may provide gain and provide a bigger output signal.

Figure 1:
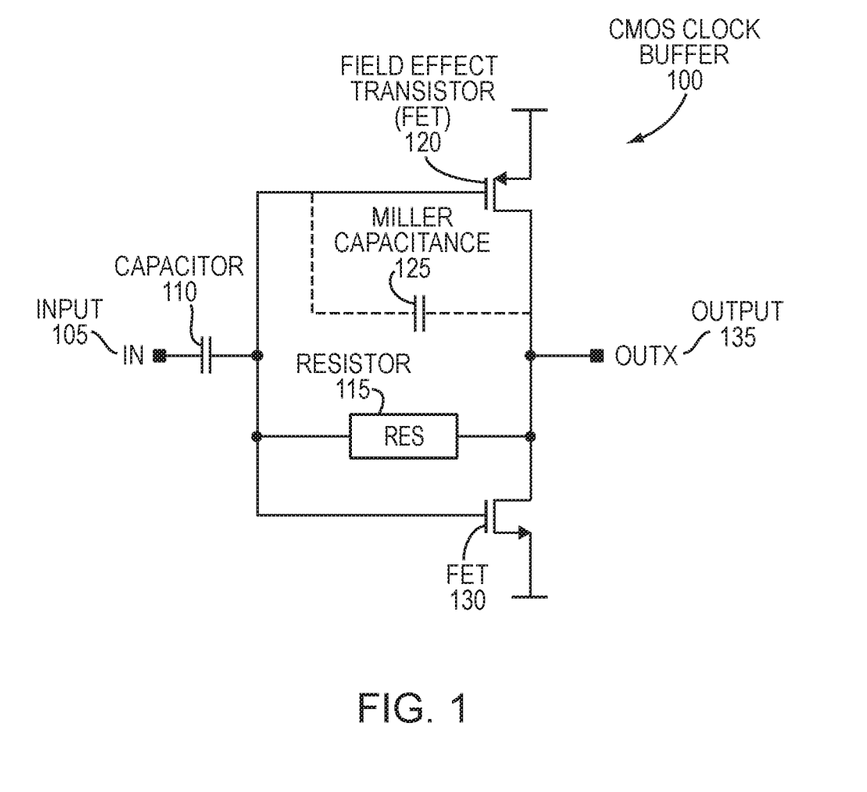
FIG. 1 is a simplified illustration of a CMOS clock buffer, in accordance with an embodiment of the present disclosure.

Refer now to the example embodiment of FIG. 1, which illustrates a CMOS clock buffer. In the example embodiment of FIG. 1, CMOS clock buffer 100 has input 105, capacitor 110, resistor 115, Field effect transistor (FET) 120, FET 130, and output 135. In this example embodiment, CMOS Clock buffer 100 suffers from Miller capacitance 125 which feeds back to input 105. As well, input 105 and output 135 are out of phase with each other. CMOS clock buffer 100 also has a low Q. As well, CMOS clock buffer's 100 capacitance becomes part of the LC tank, which is undesirable for a clock VCO, as the CMOS clock buffer 100 has a high and lossy capacitance.

Figure 2:
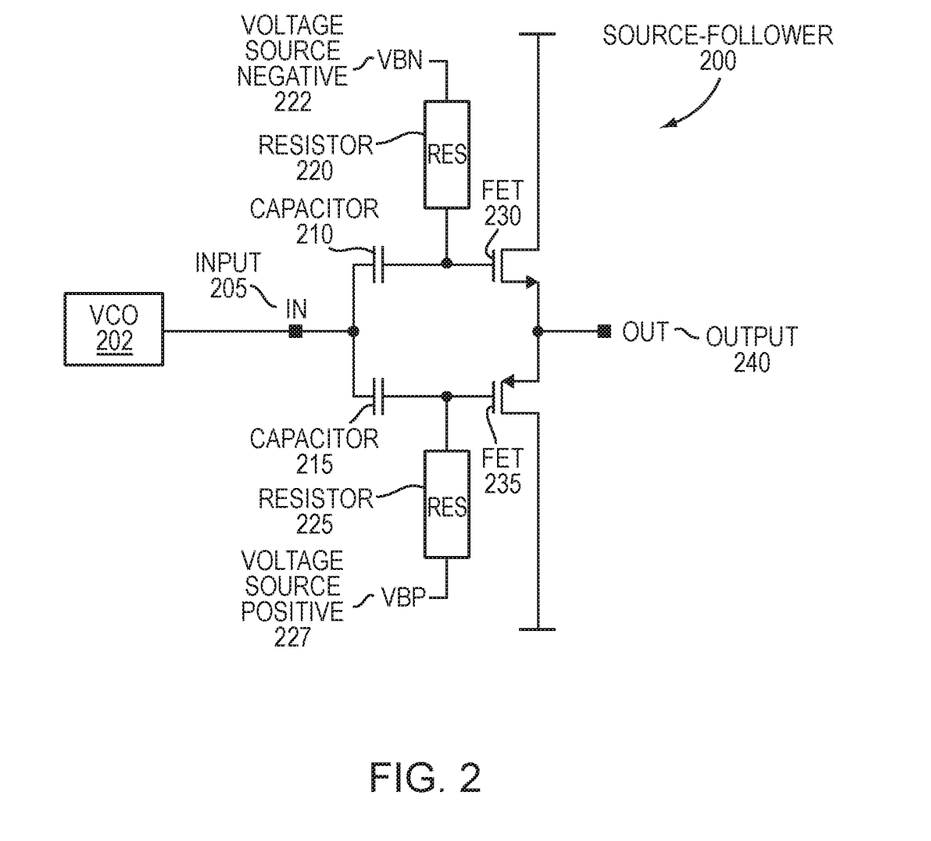
FIG. 2 is a simplified illustration of a source follower, in accordance with an embodiment of the present disclosure.

Refer now to the example embodiment of FIG. 2, which illustrates a push-pull source-follower. In the example embodiment of FIG. 2, source-follower first state 200 has input 205, which is fed by VCO 202. Source follower 200 has capacitor 210, capacitor, 215, resistor 220 fed by voltage n-type source 222, resistor 225 fed by voltage p-type source 227, FET 230, FET 235, and output 240. Source follower 200 has a high Q and a low capacitance. Input 205 and output 240 of Source follower 200 are in phase. Source follower 200 does not have gain and does not experience the Miller effect. Push-pull source follower's 200 low capacitance and a high Q does not load a VCO. Push-pull source follower 200 looks like an ideal capacitor.

Figure 3:
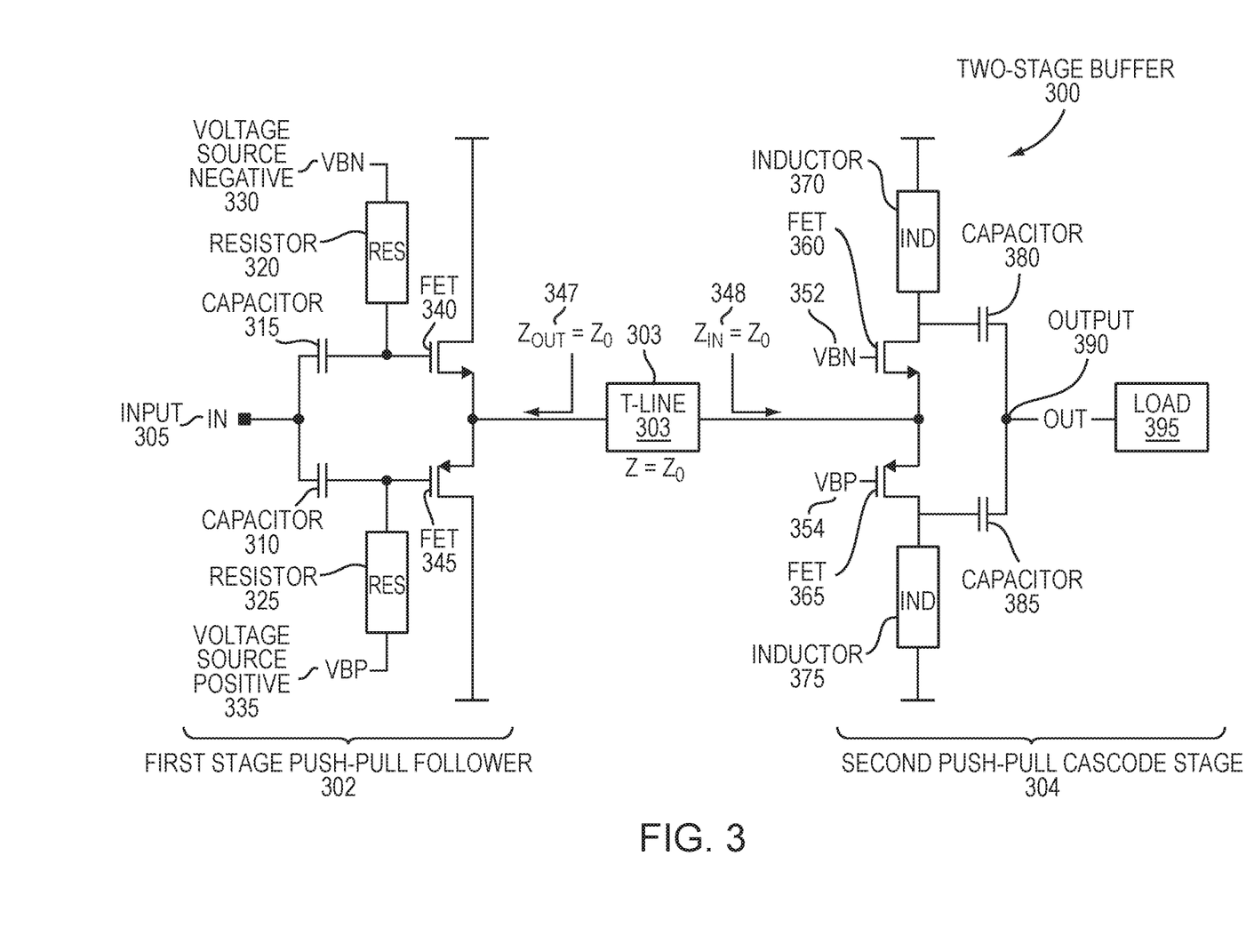
FIG. 3 is a simplified illustration of a two-stage buffer with a transmission line, in accordance with an embodiment of the present disclosure.

Refer now to the example embodiment of FIG. 3, which illustrates a first stage push-pull source follower 302 followed by a second push-pull cascode stage (common gate) 304. In the example embodiment of FIG. 3, first stage source follower 302 is connected by Transmission line 303 to second push-pull cascode stage 304. First stage push-pull follower 302 has input 305, capacitor 310 and capacitor 315, resistor 320 connected to voltage source n-type 330, resistor 325 connected to voltage source p-type 335, FET 340 and FET 345. Transmission line 303 has an input impedance that is matched to output impedance 347 of first stage push-pull follower 302.

Transmission line 303 has an output impedance that is matched to input impedance 348 of second stage push-pull cascode stage 304. Second stage push-pull cascode stage 304 has FET 360 and FET 365, Inductor 370 and Inductor 375, capacitor 380, capacitor and 385, and output 390. In the example embodiment of FIG. 3, because the input impedance of transmission line 303 is matched to the output impedance of push-pull follower 302 and output impedance of transmission line 303 is matched to input impedance of second push-pull cascode stage 304, transmission line 303 essentially disappears and has almost no cost power to drive transmission line 303. Output 390 is connected to load 395.

Figure 4:
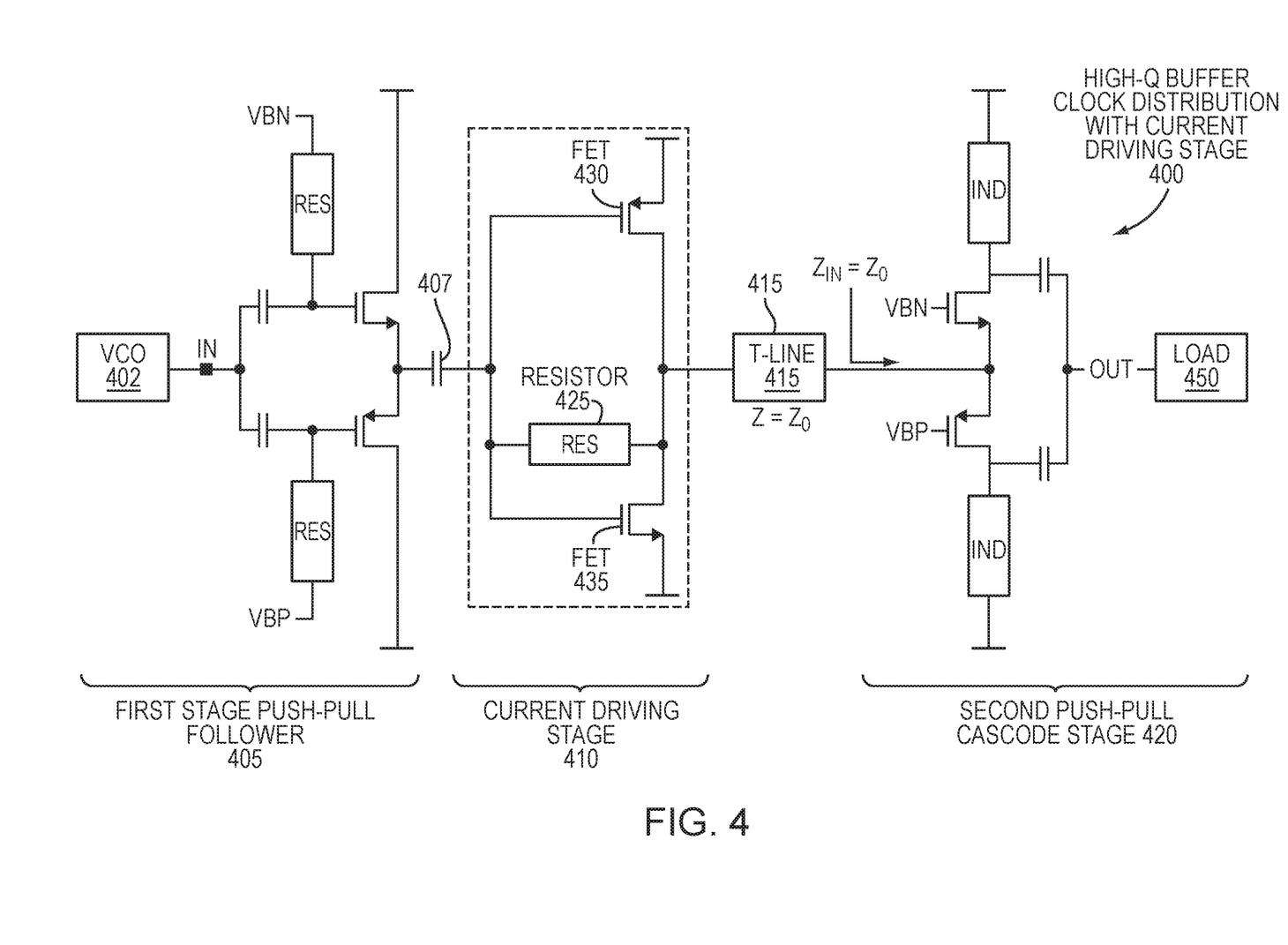
FIG. 4 is a simplified illustration of a two-stage buffer with a current driving stage, in accordance with an embodiment of the present disclosure.

Refer now to the example embodiment of FIG. 4, which illustrates a High-Q clock buffer with a first stage push-pull follower, a current driving stage, a transmission line, and a second stage push-pull cascode stage. VCO 402 is connected to first stage push-pull follower 405. First stage push-pull follower 405 is connected to current driving stage 410, with a capacitor 407. Current driving stage 410 is connected to transmission line 415, which is connected to second push-pull cascode stage 420. Current driving stage 410, has resistor 425, FET 430, and FET 435. In this example embodiment, there is insufficient grain between first state push-pull follower and second push-pull follower 405, so gain is added using current driving stage 410. Output of second push-pull cascode stage 420 is connected to load 450.

Figure 5:
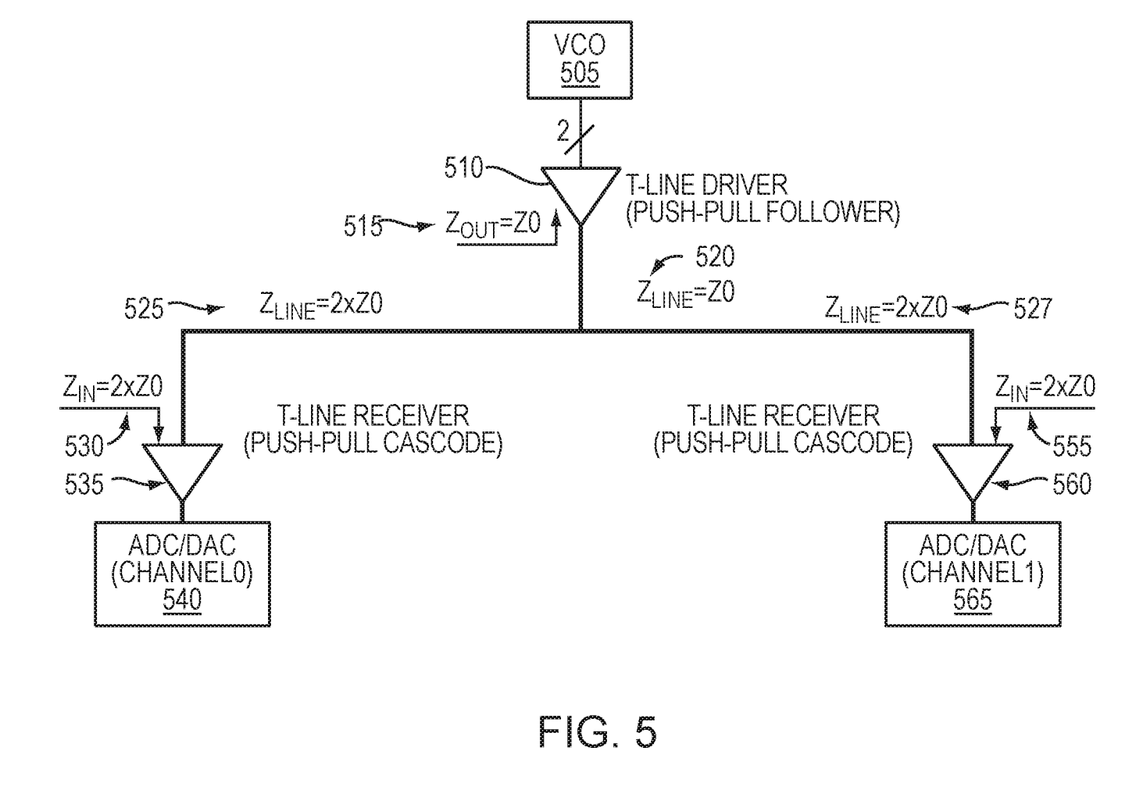
FIG. 5 is a simplified illustration of splitting a clock signal, in accordance with an embodiment of the present disclosure.

Refer now to the example embodiment of FIG. 5, which illustrates splitting a clock with a transmission line. In the example embodiment of FIG. 5, VCO 505 feeds into T-Line driver (push-pull follower) 510. The resistance of the line out of T-line 510 is given by $Z_{out}$ of Z0 515. $Z_{line}$ 520 has resistance Z0 which is equal to $Z_{out}$ of Z0. $Z_{line}$ 520 is split into $Z_{line}$ 525 and $Z_{line}$ 527. Each of $Z_{line}$ 525 and Zline 527 have a resistance of 2 times Z0. In this embodiment, by doubling the resistance of transmission line 520 when splitting to $Z_{line}$ 525 and $Z_{line}$ 527, an essentially no additional power transmission line is maintained. Transmission line $Z_{line}$ 525 is matched to the resistance of $Z_{in}$ 530, which has a resistance of 2 times Z0. $Z_{in}$ 525 is connected to T-line receiver (push-pull cascode) 535, which is connected to ADC/DAC (Channel 0) 540. $Z_{line}$ 527 inputs to $Z_{in}$ 555 which has the same resistance of $Z_{line}$ 527 of 2 times Z0. $Z_{in}$ 555 is connected to T-Line receiver (push-pull cascode) 560, which is connected to ADC/DAC (channel 1) 565.

Figure 6:
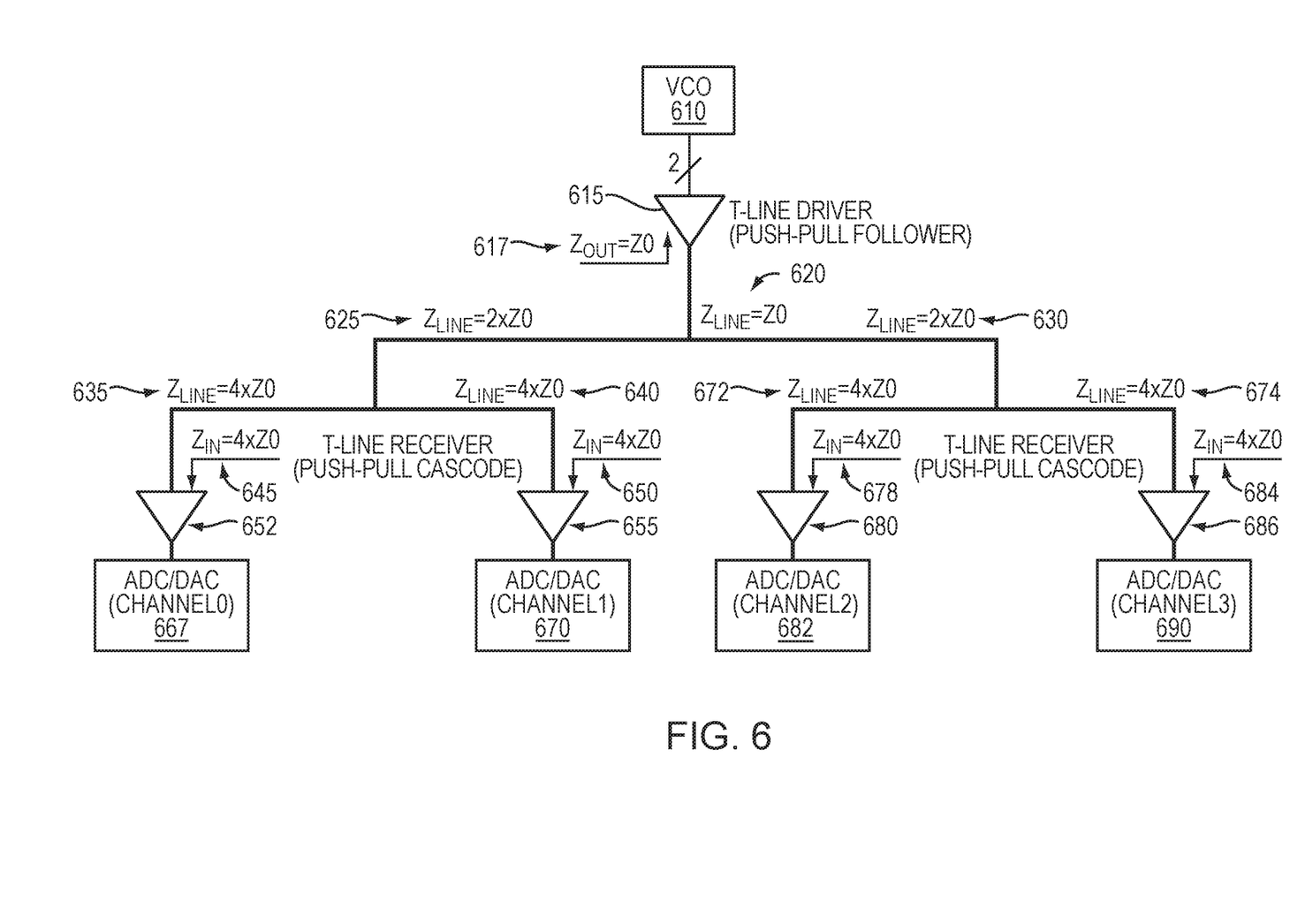
FIG. 6 is an alternative simplified illustration of splitting a clock signal, in accordance with an embodiment of the present disclosure.

Refer now to the example embodiment of FIG. 6, which illustrates splitting a clock with a transmission line into 4 different lines. In the example embodiment of FIG. 6, VCO 610 feeds into T-Line driver (push-pull follower) 615. Output $Z_{out}$ 617 resistance of t-Line 615 is Z0. $Z_{line}$ 620 has a matched resistance of Z0. $Z_{line}$ 620 splits into $Z_{line}$ 625 and $Z_{line}$ 630, both have a resistance of 2 times Z0. $Z_{line}$ 625 splits into two $Z_{lines}$, $Z_{line}$ 635 and $Z_{line}$ 640, each with a resistance of 4 times $Z_{line}$ 620 or 4 times Z0, and two times that of $Z_{line}$ 625 or 2 times 2 times Z0. $Z_{line}$ 635 is connected to $Z_{in}$ 645 of T-Line receiver (push-pull cascode) 652), which is connected to ADC/DAC (channel 0) 667. $Z_{line}$ 640 is connected to $Z_{in}$ 650 of T-Line receiver (push-pull cascode) 655), which is connected to ADC/DAC (channel 1) 670.

$Z_{line}$ 630 splits into two $Z_{lines}$, $Z_{line}$ 672 and $Z_{line}$ 674, each with a resistance of 4 times $Z_{line}$ 620 or 4 times Z0 and two times that of $Z_{line}$ 625 or 2 times 2 times Z0. $Z_{line}$ 672 is connected to $Z_{in}$ 678 of T-Line receiver (push-pull cascode) 680), which is connected to ADC/DAC (channel 2) 682. $Z_{line}$ 674 is connected to $Z_{in}$ 684 of T-Line receiver (push-pull cascode) 686), which is connected to ADC/DAC (channel 3) 690. In the example embodiment of FIG. 7, by doubling the resistance every time a transmission line is split, an essentially no power transmission line is maintained.

In some embodiments, the example embodiments of FIGS. 6 and 7 may assume that impedances may be scaled up. In certain embodiments, impedances may be scaled up when the original impedance is low enough. In other embodiments, if an original impedance is around 80 ohms, then it may not be possible scale up an impedance. In other embodiments, if it is not possible to scale up an impedance, then an impedance of a driver may be lowered instead of scaling the impedance of a transmission line. In certain embodiments, if an impedance of a driver is lowered, then clock power may change.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding,"

"composed of," and the like are to be understood to be open-ended, i.e., to mean including but not limited to. The transitional phrases "consisting of" and "consisting essentially of" shall be closed or semi-closed transitional phrases, respectively.

What is claimed is:

1. An apparatus, comprising:
   a clock buffer; wherein the clock buffer comprises a source follower; wherein the source follower comprises a voltage source and a resistor;
   a transmission line; wherein the transmission line is electrically connected to the source follower;
   a push-pull cascode stage follower; wherein the transmission line electrically connected to the push-pull cascode stage follower; and
   a current driving stage between the source follower and the transmission line.

2. The apparatus of claim 1 wherein the transmission line has an input portion and an output portion; wherein the source follower has an output; further wherein the output portion of the source follower has a same impedance as the input portion of the transmission line.

3. The apparatus of claim 1 wherein the push-pull cascode stage follower has an input; further wherein the input portion of the push-pull cascode stage follower has a same impedance as the output portion of the transmission line.

4. The apparatus of claim 1 further comprising a voltage controller oscillator (VCO).

5. The apparatus of claim 1 wherein the voltage source is a voltage n-type source (VSN); wherein the source follower has a second voltage source; wherein the second voltage source is a voltage p-type source (VPN).

6. The apparatus of claim 5 wherein the source follower has a first field effect transistor (FET) and a second FET.

7. The apparatus of claim 1 wherein the push-pull cascode stage follower has a first FET and a second FET.

8. The apparatus of claim 1 wherein the transmission line is electrically coupled to a second and third transmission line, wherein the impedance of the second transmission line is a value twice as large as the first transmission line; and wherein the impedance of the third transmission line is a value twice as large as the first transmission line.

9. The apparatus of claim 8 wherein the second transmission line is electrically coupled to a first transmission line receiver, wherein the impedance of the first transmission line receiver is matched to the impedance of the second transmission line; and wherein the third transmission line is electrically coupled to a second transmission line receiver, wherein the impedance of the second transmission line receiver is matched to the impedance of the third transmission line.

10. The apparatus of claim 8 wherein the second transmission line is coupled to a fourth transmission line and a fifth transmission line; wherein the third transmission line is coupled to a sixth and seventh transmission line; wherein the impedance value of the fourth transmission line is twice that of the second transmission line; wherein the impedance value of the fifth transmission line is twice that of the second transmission line; wherein the impedance value of the sixth transmission line is twice that of the third transmission line; and wherein the impedance value of the seventh transmission line is twice that of the third transmission line.

11. The apparatus of claim 10 wherein the fourth transmission line is electrically coupled to a first transmission line receiver, wherein the impedance of the first transmission line receiver is matched to the impedance of the fourth transmission line; wherein the fifth transmission line is electrically coupled to a second transmission line receiver, wherein the impedance of the second transmission line receiver is matched to the impedance of the fifth transmission line; wherein the sixth transmission line is electrically coupled to a third transmission line receiver, wherein the impedance of the third transmission line receiver is matched to the impedance of the sixth transmission line; and wherein the seventh transmission line is electrically coupled to a fourth transmission line receiver, wherein the impedance of the fourth transmission line receiver is matched to the impedance of the seventh transmission line.

12. A system comprising:
    a voltage-controlled oscillator (VCO); and
    a clock buffer; wherein the clock buffer comprises a source follower; wherein the source follower comprises a voltage source and a resistor; wherein the VCO is conductively connected to the clock buffer;
    transmission line; wherein the transmission line is conductively connected to the source follower;
    a push-pull cascode stage follower; wherein the transmission line conductively connected to the push-pull cascode stage follower; and
    a current driving stage between the source follower and the transmission line.

13. The system of claim 12 wherein the transmission line has an input portion and an output portion; wherein the source follower has an output; further wherein the output portion of the source follower has a same impedance as the input portion of the transmission line.

14. The system of claim 13 wherein the push-pull cascode stage follower has an input; further wherein the input portion of the push-pull cascode stage follower has a same impedance as the output portion of the transmission line.

15. The system of claim 12 wherein the transmission line splits the clock into a plurality of clock transmission lines.

* * * * *